(12) United States Patent
Yeo

(10) Patent No.: US 12,207,418 B2
(45) Date of Patent: Jan. 21, 2025

(54) METHOD FOR MANUFACTURING DISPLAY PANEL USING INKJET DEVICE

(71) Applicant: UNIJET CO., LTD., Gyeonggi-do (KR)

(72) Inventor: Gil Hwan Yeo, Gyeonggi-do (KR)

(73) Assignee: UNIJET CO., LTD., Gyeonggi-Do (KR)

( * ) Notice: Subject to any disclaimer, the term of this patent is extended or adjusted under 35 U.S.C. 154(b) by 192 days.

(21) Appl. No.: 18/112,026

(22) Filed: Feb. 21, 2023

(65) Prior Publication Data

US 2023/0269883 A1 Aug. 24, 2023

(30) Foreign Application Priority Data

Feb. 18, 2022 (KR) .................. 10-2022-0021170

(51) Int. Cl.
*B41J 2/045* (2006.01)
*B41J 25/00* (2006.01)
(Continued)

(52) U.S. Cl.
CPC .......... *H05K 3/125* (2013.01); *B41J 2/04586* (2013.01); *B41J 25/001* (2013.01); *B41J 29/02* (2013.01); *H05K 1/0281* (2013.01); *H05K 3/1283* (2013.01); *H05K 5/0018* (2022.08); *B41J 2202/03* (2013.01)

(58) Field of Classification Search
CPC ...... B41J 2/04586; B41J 25/001; B41J 29/02; B41J 2202/03; H05K 1/00281; H05K 1/189; H05K 3/125; H05K 3/1283; H05K 5/0018
See application file for complete search history.

(56) References Cited

U.S. PATENT DOCUMENTS

2013/0201640 A1* 8/2013 Kim .................. H05K 1/02
361/749

FOREIGN PATENT DOCUMENTS

JP 2003-140178 A 5/2003
JP 2017-177631 A 10/2017
(Continued)

OTHER PUBLICATIONS

Office action issued on May 1, 2024 from Korean Patent Office in a counterpart Korean Patent Application No. 10-2022-0021170 (all the cited references are listed in this IDS.) (English translation is also submitted herewith.).

*Primary Examiner* — Anh T Vo
(74) *Attorney, Agent, or Firm* — The PL Law Group, PLLC

(57) ABSTRACT

In a method for manufacturing a display panel according to an embodiment, a first anisotropic conductive layer is formed by ejecting a first anisotropic conductive layer forming material in order to bond the circuit board to the display panel, a reinforced curing layer is formed by ejecting a reinforced curing layer forming material onto a side surface of the first anisotropic conductive layer, a second anisotropic conductive layer is formed by ejecting a second anisotropic conductive layer forming material to an inner side of the second anisotropic conductive layer and the reinforced curing layer in order to bond the display drive integrated circuit, and a pixel is formed by ejecting a material for pixel printing to an inner side of the second anisotropic conductive layer for fixing the display drive integrated circuit.

21 Claims, 16 Drawing Sheets

(51) Int. Cl.
  *B41J 29/02* (2006.01)
  *H05K 1/02* (2006.01)
  *H05K 3/12* (2006.01)
  *H05K 5/00* (2006.01)

(56) References Cited

FOREIGN PATENT DOCUMENTS

| | | |
|---|---|---|
| KR | 10-0954537 B1 | 4/2010 |
| KR | 10-2013-0079374 A | 7/2013 |
| KR | 10-2021-0148456 A | 12/2021 |

* cited by examiner

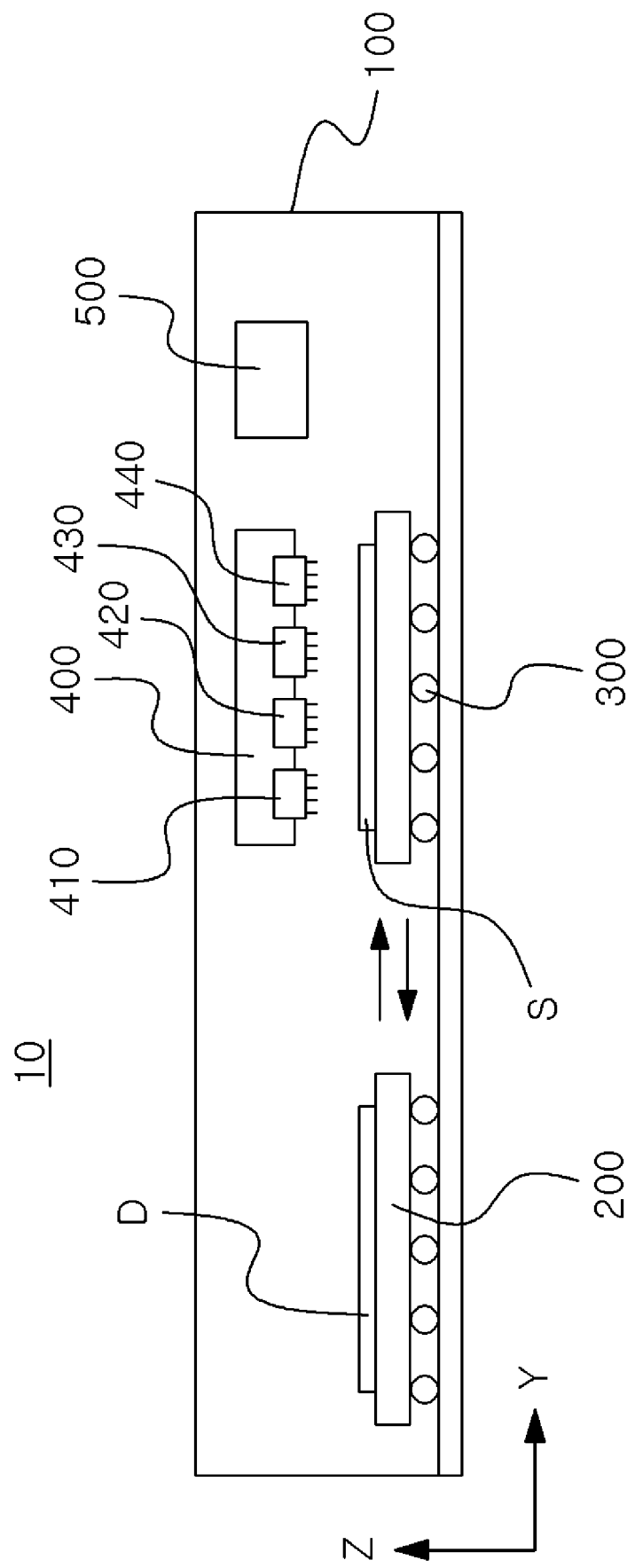

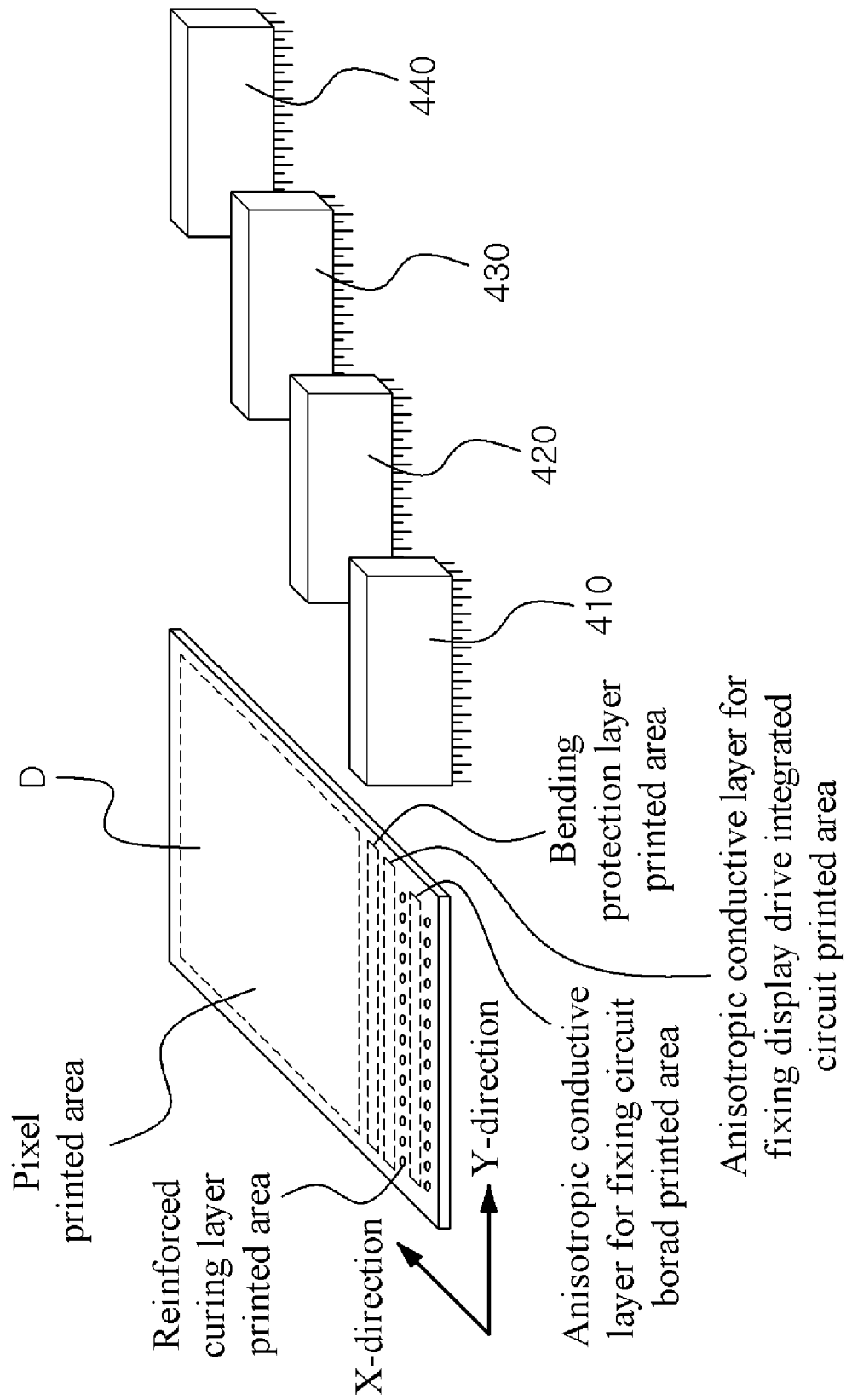

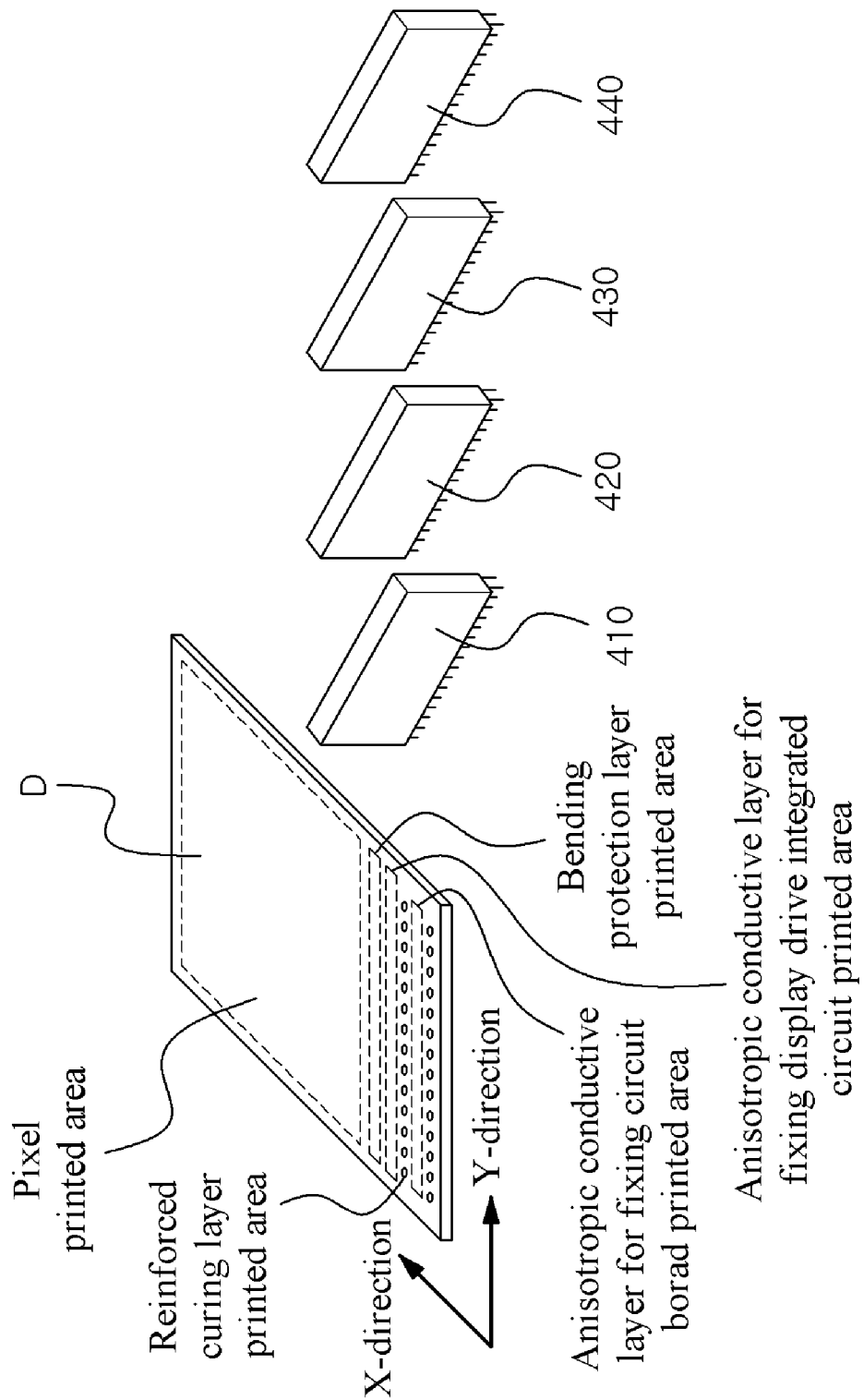

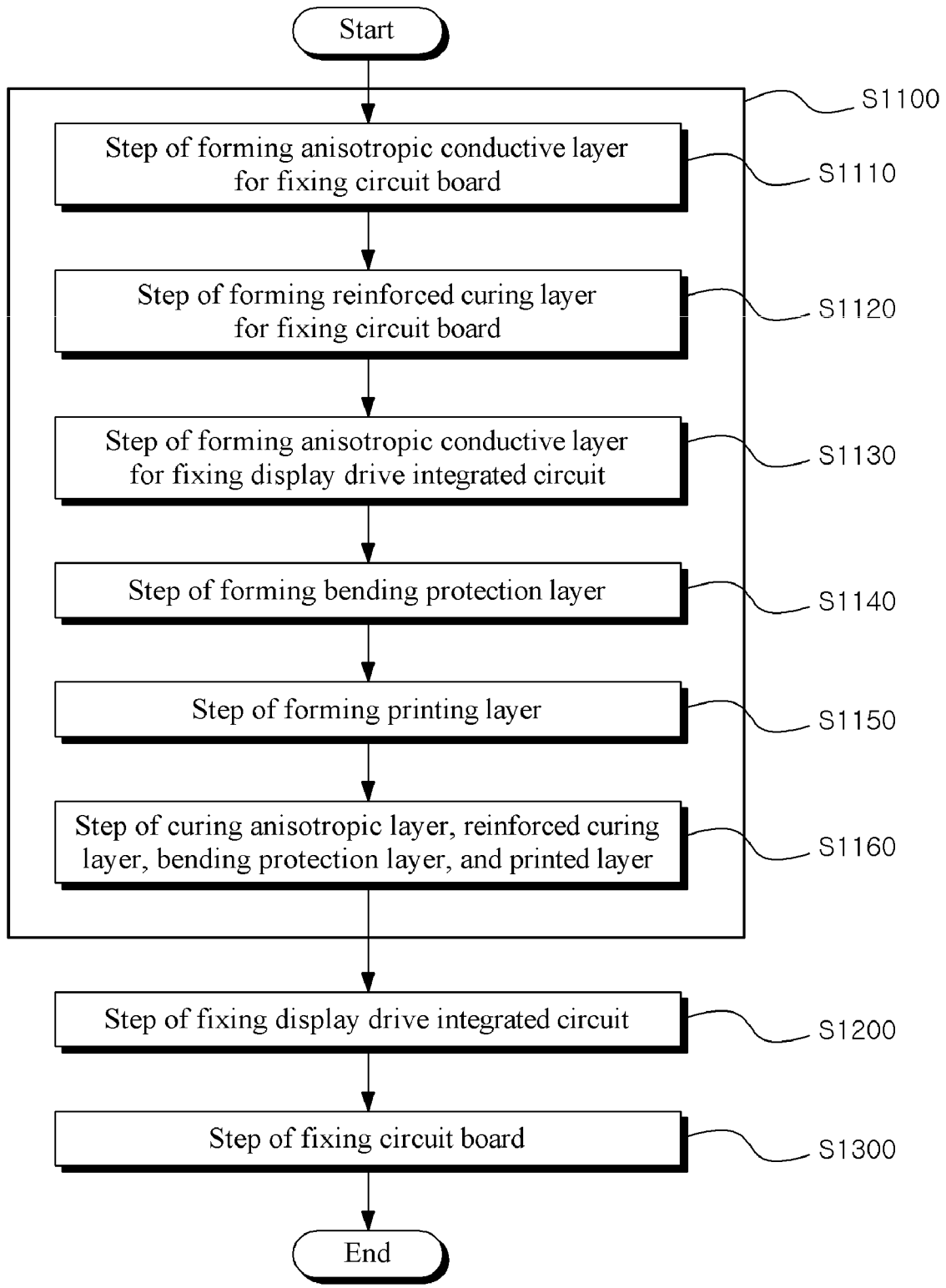

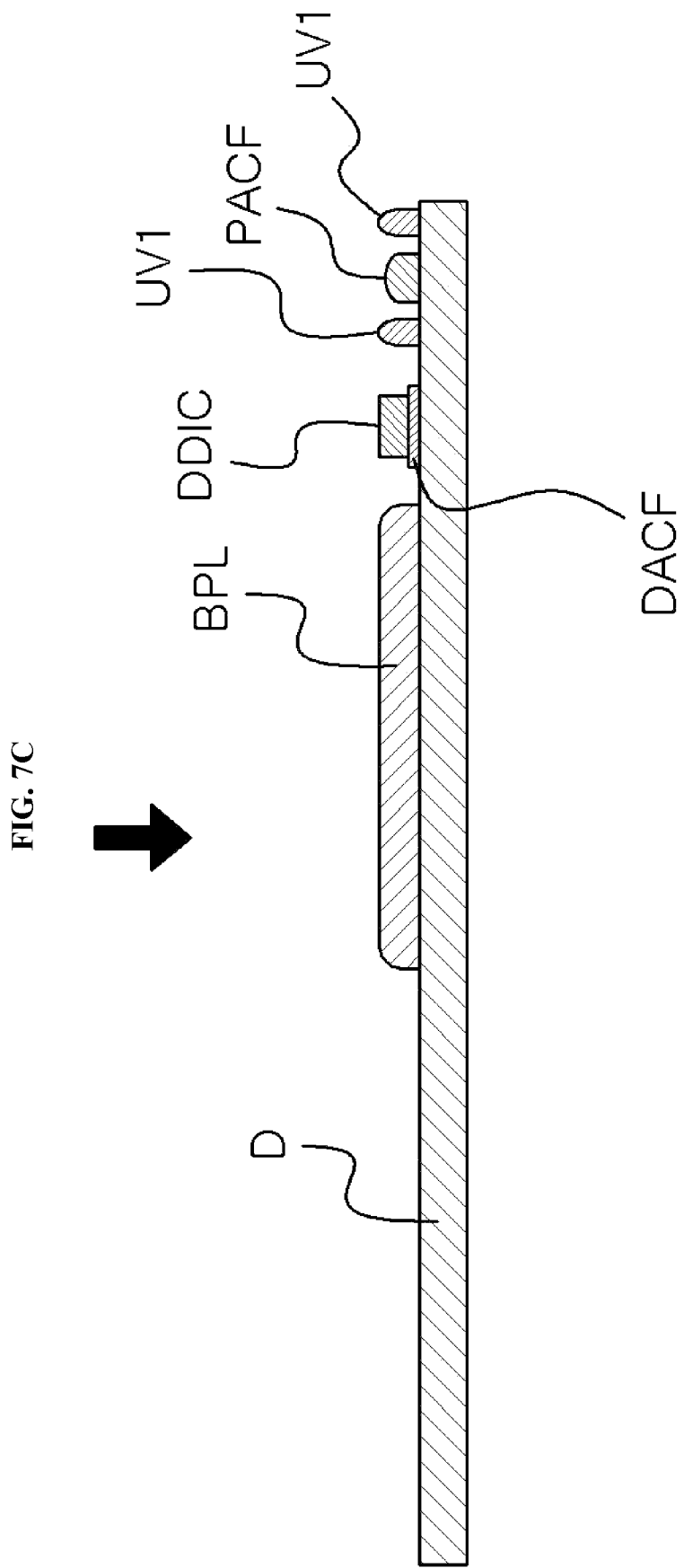

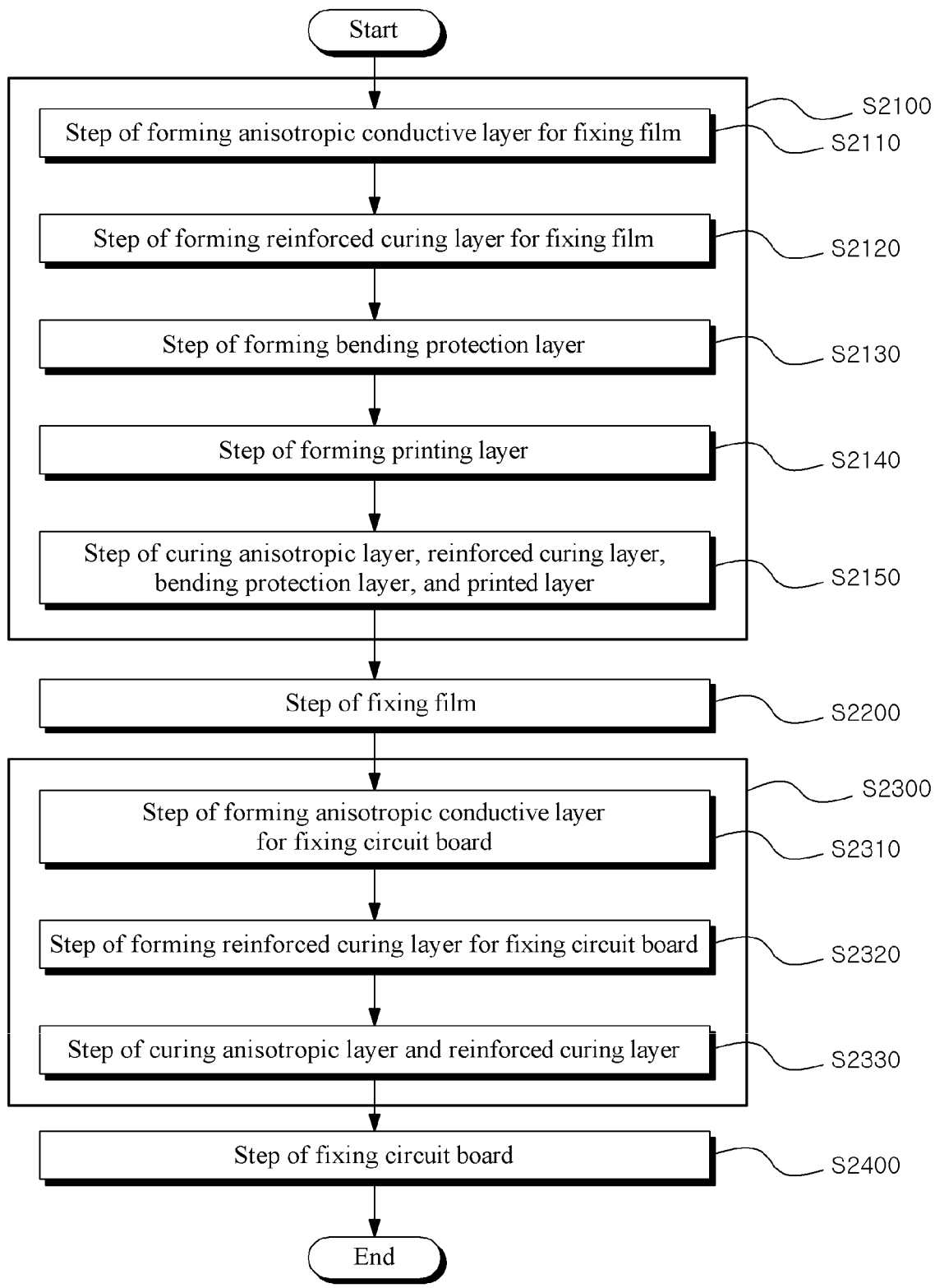

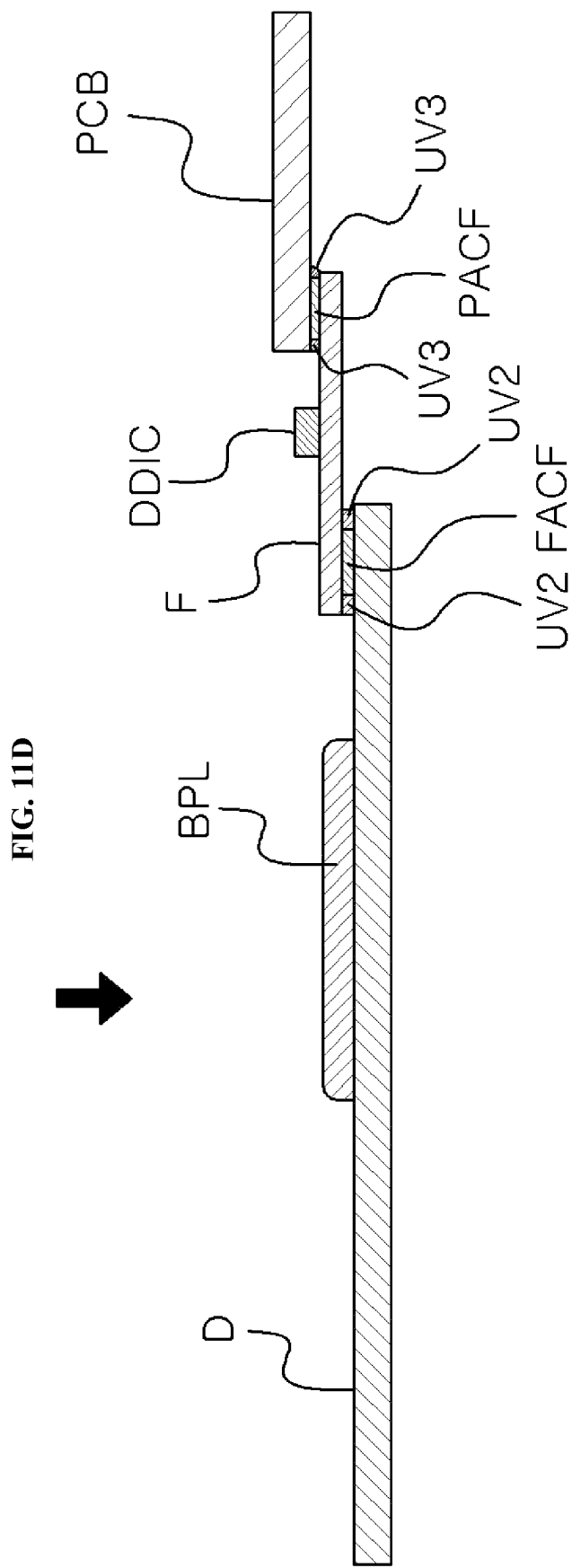

METHOD FOR MANUFACTURING DISPLAY PANEL USING INKJET DEVICE

CROSS-REFERENCE TO RELATED APPLICATIONS

This application claims the benefit under 35 USC § 119 of Korean Patent Application No. 10-2022-0021170, filed on Feb. 18, 2022, in the Korea Intellectual Property Office, the entire disclosure of which is incorporated herein by reference for all purposes.

BACKGROUND

1. Field

The present invention relates to a method and a device for bonding a bending protection layer BPL, a flexible circuit board FPCB, and/or a film to a display panel by way of anisotropic conductive material with an inkjet device.

2. Background Art

When a display device is manufactured, a circuit board PCB for transmitting operation signals and a display drive integrated circuit DDIC for driving a display are required to be electrically bonded to each other on a display panel.

A method for bonding the display drive integrated circuit and the circuit board to the display panel is classified into a chip on plastic (COP) process of bonding the display drive integrated circuit to the display panel and a chip on film (COF) process of bonding the display drive integrated circuit to a film bonded to the display panel according to an installation position of the display drive integrated circuit.

As illustrated in FIG. 1A, the COP process bonds an anisotropic conductive film DACF to an outer side of a display panel D and then compresses and bonds the display drive integrated circuit DDIC to the anisotropic conductive film DACF.

Thereafter, a process of bonding an anisotropic conductive film PACF to an end of the display panel D and compressing and bonding the circuit board PCB thereon is performed.

Thereafter, as a reinforced curing layer UV is formed by applying a curing material around the display drive integrated circuit DDIC to which the anisotropic conductive film PACF fixed to the circuit board PCB is bonded and the circuit board PCB and curing the curing material by ultraviolet rays, adhesion and operational reliability of the anisotropic conductive film are secured.

Lastly, a bending protection layer BPL is formed on the display panel by using a dispenser.

As illustrated in FIG. 1B, the COF process bonds an anisotropic conductive film FACF to an outer side of the display panel D and then compresses and bonds the film F to which the display drive integrated circuit DDIC is bonded to the anisotropic conductive film FACF.

Thereafter, a process of bonding the anisotropic conductive film PACF to an end of the film F and compressing and bonding the circuit board PCB thereon is performed.

Thereafter, as the reinforced curing layer UV is applied around the film F to which the anisotropic conductive film is bonded and the circuit board PCB and then cured by ultraviolet rays, adhesion and operational reliability of the anisotropic conductive film are secured.

Lastly, a bending protection layer BPL is formed on the display panel by using a dispenser.

In the above-described both processes, the bonding process of using the anisotropic conductive film is performed two times in the COP process or the COF process, and then the bending protection layer and the reinforced curing layer for reliability of the anisotropic conductive film are formed.

Thus, since the process of bonding the anisotropic conductive film is performed two times, and the reinforced curing layer for the reliability of the anisotropic conductive film is printed and cured on each of upper and lower portions of the display panel, each of a process time and a length of equipment increases.

Also, since the panel is required to be turned over in order to apply the reinforced curing layer for the reliability of the anisotropic conductive film onto the lower portion of the panel, the reinforced curing layer may be formed on the rear side of the display panel when an applied amount is great or an applied position is not exact, and a removal operation thereof may be required.

Since the anisotropic conductive film has a constant thickness, the anisotropic conductive film is primarily bonded onto a circuit of a circuit pattern part, and then a display drive integrated circuit, a film, or a circuit board is compressed and bonded thereon.

Since a portion to be formed into an electrode in the circuit pattern part is higher than a portion that is not formed into the electrode, the circuit pattern parts in which conductive particles of the anisotropic conductive layers are vertically disposed are connected during a compression process, so that electrical signals are connected.

However, as anisotropic conductive particles and binders, which form the film and are not used for conduction, are moved to left and right sides due to compression, repulsive force of the compression occurs.

Here, when an unstable bonding process is performed, the conduction may not occur in some electrodes.

Furthermore, since the anisotropic conductive film is used in areas other than electrodes, unnecessary use of the anisotropic conductive particles and the binders may increase.

SUMMARY

The present invention provides a method and a device for simply and easily bonding a display drive integrated circuit, a bending protection layer BPL, a circuit board PCB, and a film F to a display panel by using an anisotropic conductive material.

In order to solve the above-described technical problem, a method for manufacturing a display panel through a chip on plastic process step S1000 by using an inkjet device includes a printing step S1100 including: a step S1110 of forming an anisotropic conductive layer PACF for fixing a circuit board by ejecting an anisotropic conductive layer forming material from an anisotropic conductive layer ejection head of the inkjet device in order to bond the circuit board to an end of the display panel; a step S1120 of forming a reinforced curing layer UV1 by ejecting a reinforced curing layer forming material from a reinforced curing layer ejection head of the inkjet device onto a side surface of the anisotropic conductive layer PACF formed in the step S1110; a step S1130 of forming an anisotropic conductive layer DACF for fixing a display drive integrated circuit by ejecting an anisotropic conductive layer forming material from an anisotropic conductive layer ejection head of the inkjet device to an inner side of the anisotropic conductive layer PACF and the reinforced curing layer UV1 formed in the step S1120 in order to bond the display drive integrated circuit; and a step S1150 of forming a pixel by ejecting a material for pixel printing from a printing head of the inkjet device to an inner side of the anisotropic conductive layer DACF for fixing the display drive integrated circuit, which is formed in the step S1130.

In the method for manufacturing the display panel according to the present invention, the reinforced curing layer UV1 may be formed on each of both sides of the anisotropic conductive layer PACF for fixing the circuit board in the step S1120.

In the method for manufacturing the display panel according to the present invention, the anisotropic conductive layers may be made of different anisotropic conductive layer forming materials in the step S1110 and the step S1130.

In the method for manufacturing the display panel according to the present invention, the printing step S1100 may further include a step S1140 of forming a bending protection layer BPL by ejecting a bending protection layer forming material from a bending protection layer ejection head of the inkjet device to an inner side of the reinforced curing layer UV1 formed in the step S1130 in order to support bending stress.

In the method for manufacturing the display panel according to the present invention, the printing step S1100 may further include a step S1160 of pre-curing or curing a plurality of ejection layers formed in the steps S1110 to S1150.

In the method for manufacturing the display panel according to the present invention, the method may further include, after performing the printing step S1100, a step S1200 of compressing and fixing a display drive integrated circuit DDIC to the anisotropic conductive layer DACF for fixing the display drive integrated circuit.

In the method for manufacturing the display panel according to the present invention, the method may further include, after performing the step S1200, a step S1300 of compressing and fixing a circuit board PCB to the anisotropic conductive layer PACF for fixing the circuit board and the reinforced curing layer UV1.

In order to solve the above-described technical problem, an inkjet device for manufacturing a display panel through the chip on plastic process step S1000 includes: a housing; a plate configured to support a substrate in the housing; a transfer device configured to transfer the plate in a substrate printing direction; and a head module configured to eject ink droplets onto the substrate, and the head module includes: an anisotropic conductive layer ejection head configured to form an anisotropic conductive layer on the display panel; a reinforced curing layer ejection head configured to reinforce the anisotropic conductive layer on the display panel; a bending protection layer ejection head configured to form a bending protection layer configured to support bending stress on the display panel; and a printing head configured to print a pixel on the display panel.

In the inkjet device according to the present invention, the anisotropic conductive layer ejection head, the reinforced curing layer ejection head, the bending protection layer ejection head, and the pixel printing head may be sequentially arranged in a Y-direction while a longitudinal direction of each thereof is arranged in a X-direction so as to be sequentially formed in a transfer direction (Y-direction) of the display panel while each of a plurality of printed layers formed by the head module extends in a transverse direction (X-direction) of the display panel.

In the inkjet device according to the present invention, the anisotropic conductive layer ejection head, the reinforced curing layer ejection head, the bending protection layer ejection head, and the pixel printing head may be sequentially arranged in a X-direction while a longitudinal direction of each thereof is arranged in a Y-direction so as to be sequentially formed in a transverse direction (X-direction) of the display panel while each of a plurality of printed layers formed by the head module extends in a transfer direction (Y-direction) of the display panel.

In the inkjet device according to the present invention, the anisotropic conductive layer ejection head, the reinforced curing layer ejection head, the bending protection layer ejection head, and the pixel printing head may be sequentially arranged in a X-direction while a longitudinal direction of each thereof is inclined in a Y-direction so as to be sequentially formed in a transverse direction (X-direction) of the display panel while each of a plurality of printed layers formed by the head module extends in a transfer direction (Y-direction) of the display panel.

In the inkjet device according to the present invention, the anisotropic conductive layer ejection head may be provided in plurality to eject different anisotropic conductive layer forming materials.

In the inkjet device according to the present invention, the inkjet device may further include a curing device configured to cure an ejection material printed by the inkjet head.

In order to solve the above-described technical problem, a method for manufacturing a display panel through a chip on plastic process step S2000 by using an inkjet device includes a primary printing step S2100 including: a step S2110 of forming an anisotropic conductive layer FACF for fixing a film by ejecting an anisotropic conductive layer forming material from an anisotropic conductive layer ejection head of the inkjet device in order to bond the film to an end of the display panel; a step S2120 of forming a reinforced curing layer UV2 by ejecting a reinforced curing layer forming material from a reinforced curing layer ejection head of the inkjet device onto a side surface of the anisotropic conductive layer FACF for fixing the film, which is formed in the step S2110; and a step S2140 of forming a pixel by ejecting a material for pixel printing from a printing head of the inkjet device to an inner side of a bending protection layer BPL formed in a step S2130.

In the method for manufacturing the display panel according to the present invention, in the step S2120, the reinforced curing layer UV2 may be formed on each of both sides of the anisotropic conductive layer FACF for fixing the film.

In the method for manufacturing the display panel according to the present invention, the primary printing step S2100 may include the step S2130 of forming the bending protection layer BPL by ejecting a bending protection layer forming material from a bending protection layer ejection head of the inkjet device to an inner side of the reinforced curing layer UV2 formed in the step S2120 for bending protection.

In the method for manufacturing the display panel according to the present invention, the primary printing step S2100 may include a step S2150 of pre-curing or curing a plurality of ejection layers formed in the steps S2110 to S2140.

In the method for manufacturing the display panel according to the present invention, the method may further include, after performing the primary printing step S2100, a step S2200 of compressing and fixing one end of a film F to which a display drive integrated circuit is fixed to the anisotropic conductive layer FACF for fixing the film and the reinforced curing layer UV2.

In the method for manufacturing the display panel according to the present invention, the method may further include, after performing the film fixing step S2200, a secondary printing step S2300 including: a step S2310 of forming an anisotropic conductive layer PACF for fixing a circuit board by ejecting an anisotropic conductive layer forming material from an anisotropic conductive layer ejection head of the inkjet device in order to bond the film to an end of the film F; and a step S2320 of forming a reinforced curing layer UV3 by ejecting a reinforced curing layer forming material from a reinforced curing layer ejection head of the inkjet device onto a side surface of the anisotropic conductive layer PACF for fixing the circuit board, which is formed in the step S2310.

In the method for manufacturing the display panel according to the present invention, the secondary printing step S2300 may include a step S2330 of pre-curing or curing a plurality of ejection layers formed in the steps S2310 to S2320.

In the method for manufacturing the display panel according to the present invention, the method may further include, after performing the secondary printing step S2300, a step S2400 of compressing and fixing one end of a circuit board PCB to the anisotropic conductive layer PACF for fixing the circuit board and the reinforced curing layer UV3.

In order to solve the above-described technical problem, an inkjet device for performing the primary printing step S2100 to manufacture a display panel through the chip on plastic process step S2000 includes: a housing; a plate configured to support a substrate in the housing; a transfer device configured to transfer the plate in a substrate printing direction; and a head module configured to eject ink droplets onto the substrate, and the head module includes: an anisotropic conductive layer ejection head configured to form an anisotropic conductive layer on the display panel; a reinforced curing layer ejection head configured to reinforce the anisotropic conductive layer on the display panel; a bending protection layer ejection head configured to form a bending protection layer configured to support bending stress on the display panel; and a printing head configured to print a pixel on the display panel.

In the inkjet device according to the present invention, the anisotropic conductive layer ejection head, the reinforced curing layer ejection head, the bending protection layer ejection head, and the pixel printing head may be sequentially arranged in a Y-direction while a longitudinal direction of each thereof is arranged in a X-direction so as to be sequentially formed in a transfer direction (Y-direction) of the display panel while each of a plurality of printed layers formed by the head module extends in a transverse direction (X-direction) of the display panel.

In order to solve the above-described technical problem, an inkjet device for performing the secondary printing step S2300 to manufacture a display panel through the chip on plastic process step S2000 includes: a housing; a plate configured to support a substrate in the housing; a transfer device configured to transfer the plate in a substrate printing direction; and a head module configured to eject ink droplets onto the substrate, and the head module includes: an anisotropic conductive layer ejection head configured to form an anisotropic conductive layer on the display panel; and a reinforced curing layer ejection head configured to reinforce the anisotropic conductive layer on the display panel.

In the inkjet device according to the present invention, the anisotropic conductive layer ejection head and the reinforced curing layer ejection head may be sequentially arranged in a Y-direction while a longitudinal direction of each thereof is arranged in a X-direction so as to be sequentially formed in a transfer direction (Y-direction) of the display panel while each of a plurality of printed layers formed by the head module extends in a transverse direction (X-direction) of the display panel.

In the inkjet device according to the present invention, the inkjet device may further include a curing device configured to cure an ejection material printed by the inkjet head.

BRIEF DESCRIPTION OF THE DRAWINGS

The accompanying drawings are included to provide a further understanding of the inventive concept, and are incorporated in and constitute a part of this specification. The drawings illustrate embodiments of the inventive concept and, together with the description, serve to explain principles of the inventive concept. In the drawings:

FIG. 2 is a view illustrating a method for manufacturing a display according to the present invention;

FIG. 4 is a view illustrating a second embodiment of an array of a plurality of heads in an inkjet device that performs a chip on plastic process in the method for manufacturing the display according to the present invention;

FIG. 5 is a view illustrating a third embodiment of an array of a plurality of heads in an inkjet device that performs a chip on plastic process in the method for manufacturing the display according to the present invention;

FIG. 6 is a flowchart representing a chip on plastic process step in the method for manufacturing the display according to the present invention;

FIGS. 7A to 7D are a view illustrating the chip on plastic process step in the method for manufacturing the display according to the present invention;

FIG. 10 is a flowchart representing a chip on film process step in the method for manufacturing the display according to the present invention; and FIGS. 11A to 11D are a view illustrating the chip on film process step in the method for manufacturing the display according to the present invention.

DETAILED DESCRIPTION

Figure 1A:
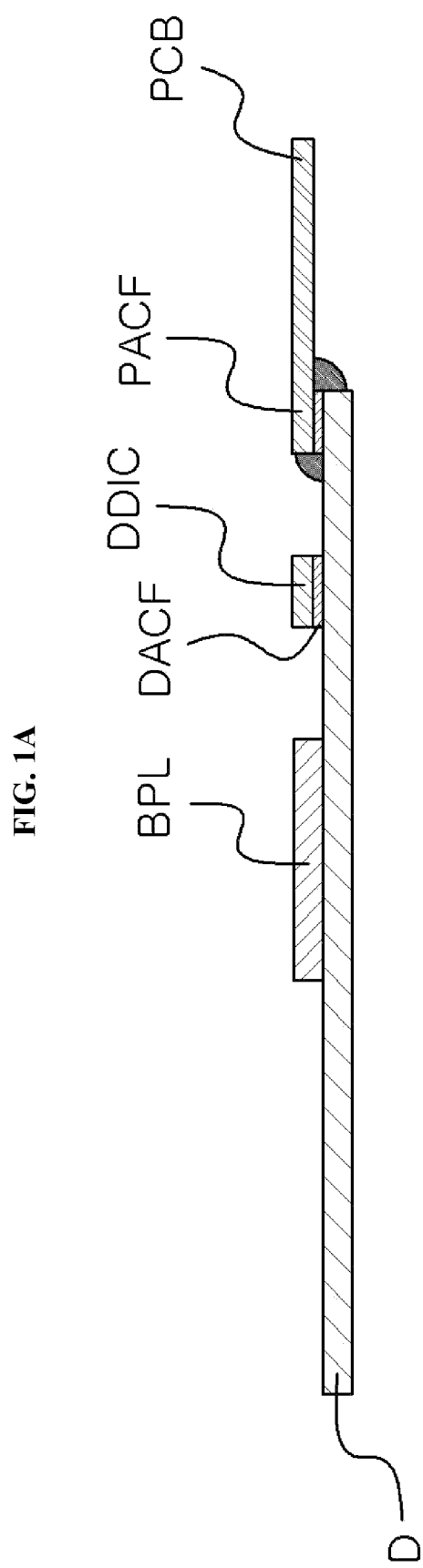
FIGS. 1A and 1B are a view illustrating a method for manufacturing a display according to the related art.
Figure 1B:
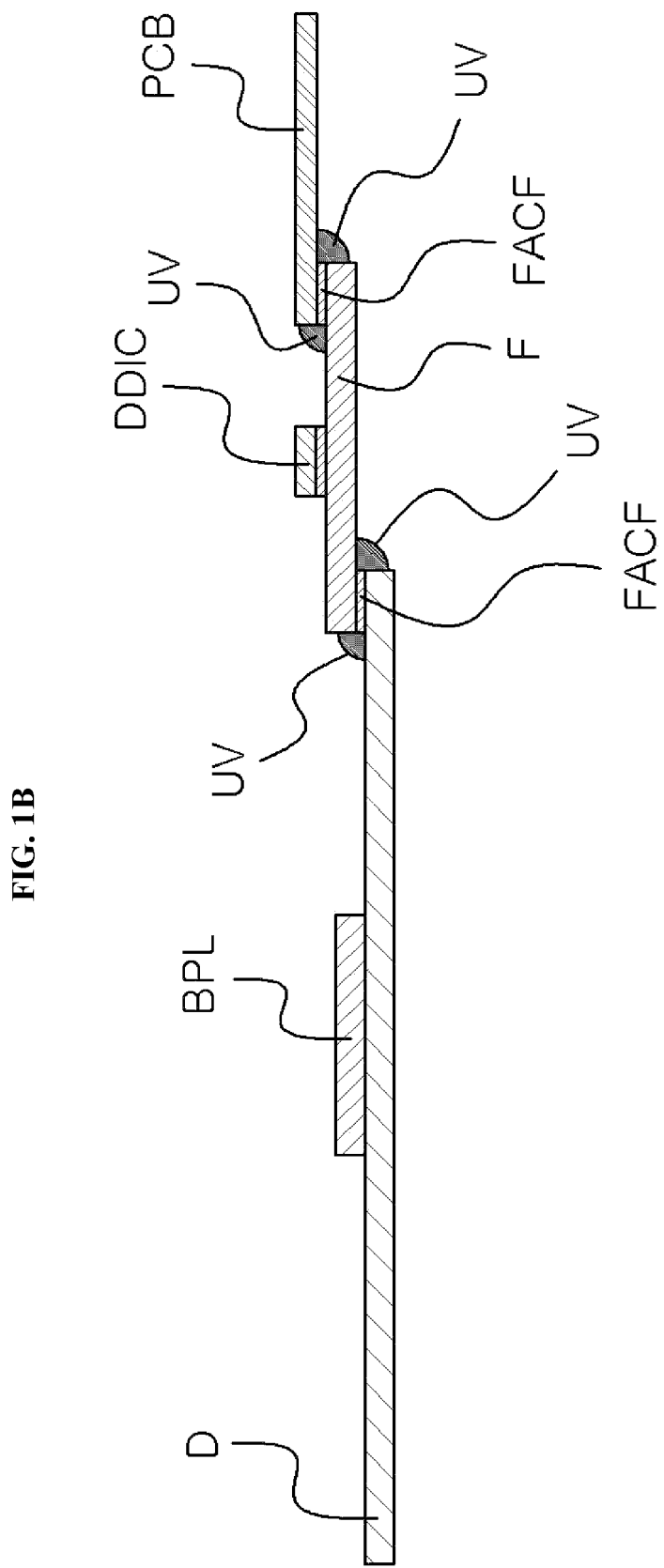

Hereinafter, an embodiment of the present invention will be described with reference to the accompanying drawings.
[Inkjet Device for Chip on Plastic Process]

FIG. 2 is a view illustrating an inkjet device for performing a method for manufacturing a display according to the present invention.

The inkjet device according to the present invention has the same configuration as a typical inkjet device in that the inkjet device according to the present invention includes: a housing 100; a plate 200 for supporting a display panel in the housing 100; a transfer device 300 for transferring the plate 200 in a substrate printing direction; a head module 400 for ejecting ink droplets onto the display panel; and a curing module 500 for curing the ink ejected onto the substrate.

However, the head module 400 has a different configuration that will be described below.

The head module 400 in the inkjet device 10 for a chip on plastic (COP) process includes: an anisotropic conductive layer ejection head 410 for forming an anisotropic conductive layer on a display panel D; a reinforced curing layer ejection head 420 for reinforcing the anisotropic conductive layer on the display panel; a bending protection layer ejection head 430 for forming a bending protection layer BLP on the display panel; and a printing head 440 for printing pixels on the display panel.

Figure 3:
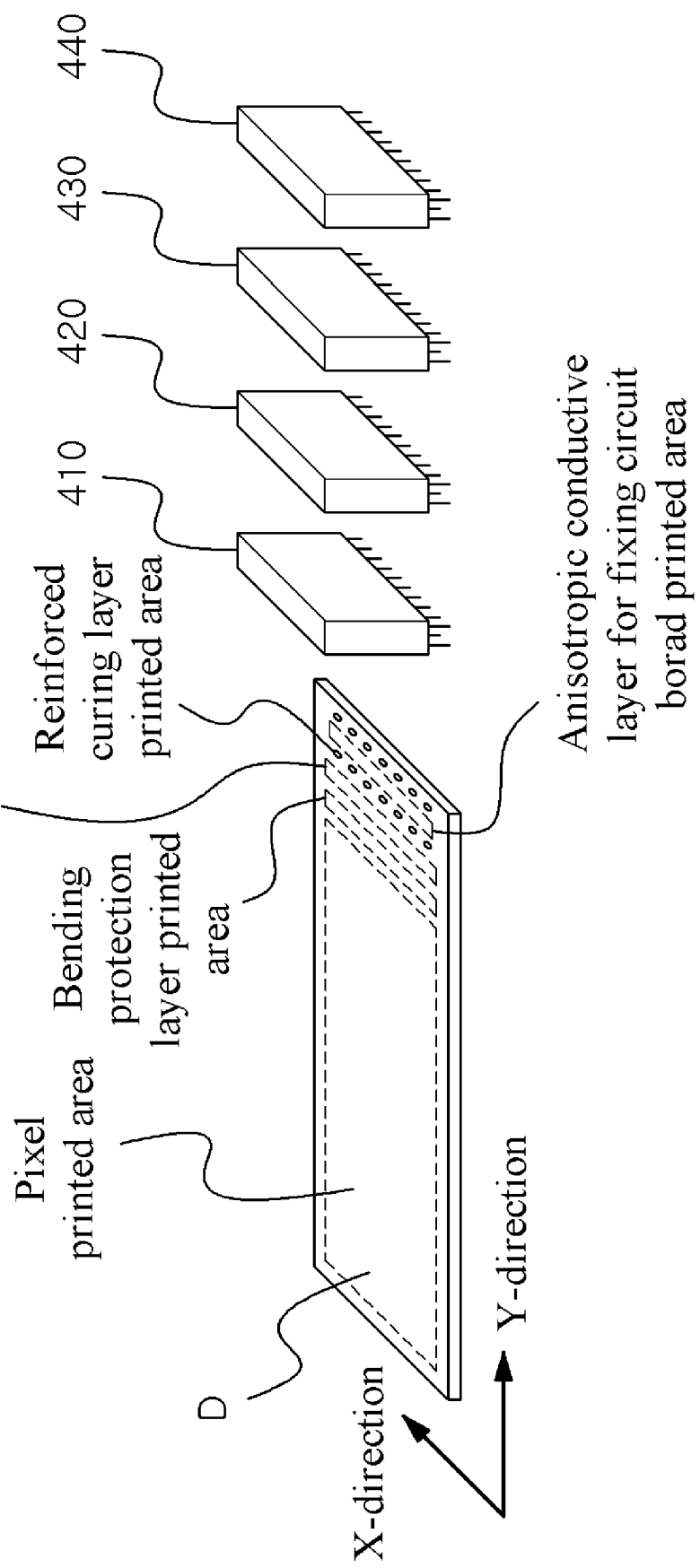
FIG. 3 is a view illustrating a first embodiment of an array of a plurality of heads in an inkjet device that performs a chip on plastic process in the method for manufacturing the display according to the present invention.

FIG. 3 is a view illustrating a first embodiment of an array of a plurality of heads in the inkjet device that performs the COP process in a method for manufacturing the display according to the present invention.

As illustrated in FIG. 3, in the first embodiment of the array of the plurality of heads of the inkjet device for the COP process, the anisotropic conductive layer ejection head 410, the reinforced curing layer ejection head 420, and the bending protection layer ejection head 430, and the printing head 440 are sequentially arranged in a Y-direction while a longitudinal direction of each thereof is arranged in a X-direction so as to be sequentially formed in a transfer direction (Y-direction) of the display panel while each of a plurality of printed layers formed by the head module 400 extends in a transverse direction (X-direction) of the display panel D.

FIG. 4 is a view illustrating a second embodiment of an array of a plurality of heads in the inkjet device that performs the COP process in the method for manufacturing the display according to the present invention.

As illustrated in FIG. 4, in the second embodiment of the array of the plurality of heads of the inkjet device for the COP process, the anisotropic conductive layer ejection head 410, the reinforced curing layer ejection head 420, and the bending protection layer ejection head 430, and the printing head 440 are sequentially arranged in the X-direction while a longitudinal direction of each thereof is arranged in the Y-direction so as to be sequentially formed in the transverse direction (X-direction) of the display panel while each of a plurality of printed layers formed by the head module 400 extends in the transfer direction (Y-direction) of the display panel D.

FIG. 5 is a view illustrating a third embodiment of an array of a plurality of heads in the inkjet device that performs the COP process in the method for manufacturing the display according to the present invention.

As illustrated in FIG. 5, in the third embodiment of the array of the plurality of heads of the inkjet device for the COP process, the anisotropic conductive layer ejection head 410, the reinforced curing layer ejection head 420, and the bending protection layer ejection head 430, and the printing head 440 are sequentially arranged in the X-direction while each being inclined in the Y-direction so as to be sequentially formed in the transverse direction (X-direction) of the display panel while each of a plurality of printed layers formed by the head module 400 extends in the transfer direction (Y-direction) of the display panel D.

[Chip on Plastic Process]

FIG. 6 is a flowchart representing the COP process in the method for manufacturing the display according to the present invention. FIGS. 7A to 7D are a view illustrating the COP process in the method for manufacturing the display according to the present invention.

The method for manufacturing the display panel by using a COP process step S1000 according to the present invention is performed as follows.

The COP process step S1000 includes a printing step S1100, a step S1200 for fixing a display drive integrated circuit, and a step S1300 for fixing a circuit board.

Figure 7A:
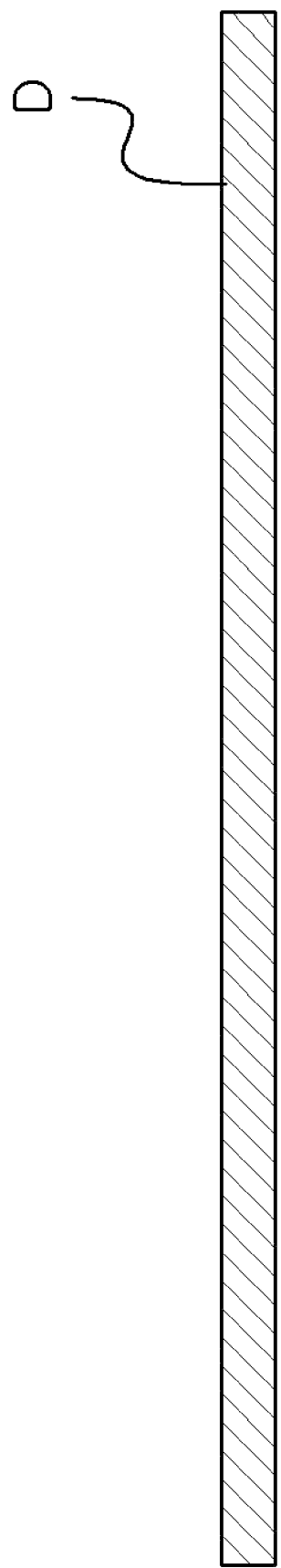
Figure 7B:
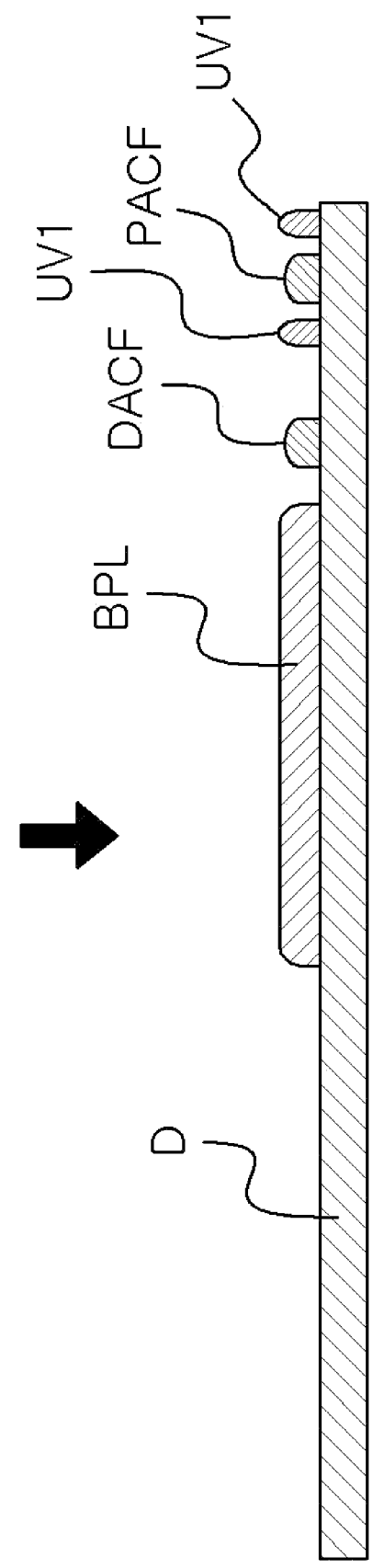

As illustrated in FIG. 7B, the printing step S1100 include a step S1110 of forming an anisotropic conductive layer PACF for fixing a circuit board by ejecting an anisotropic conductive layer forming material from the anisotropic conductive layer ejection head of the inkjet device in order to bond the circuit board at an end of the display panel D.

The anisotropic conductive layer forming material includes anisotropic conductive particles and binders as same as a material of a typical anisotropic conductive film.

The printing step S1100 includes a step S1120 of forming a reinforced curing UV1 layer by ejecting a reinforced curing layer forming material from the reinforced curing layer ejection head of the inkjet device onto a side surface of the anisotropic conductive layer PACF for fixing the circuit board, which is formed in the step S1110.

A resin-based material is typically used as the reinforced curing layer forming material.

The reinforced curing layer UV1 may be formed on each of both sides of the anisotropic conductive layer PACF for fixing the circuit board in the step S1120.

The printing step S1100 includes a step S1130 of forming the anisotropic conductive layer DACF for fixing the display drive integrated circuit by ejecting an anisotropic conductive layer forming material from the anisotropic conductive layer ejection head of the inkjet device to an inner side of the anisotropic conductive layer PACF and the reinforced curing layer UV1 formed in the step S1120 in order to bond the display drive integrated circuit DDIC.

Here, the display drive integrated circuit is provided for drive of a display device.

The material ejected from the anisotropic conductive layer ejection head of the inkjet device in the step S1130 may be different from the anisotropic conductive layer forming material ejected in the step S1110.

In this case, forming each inkjet head separately is advantageous in terms of a manufacturing process.

The printing step S1100 includes a step S1140 of forming the bending protection layer BPL by ejecting a bending protection layer forming material from the bending protection layer ejection head of the inkjet device at an inner side of the reinforced curing layer UV1 formed in the step S1120 for bending protection.

A resin-based material is typically used as the bending protection layer forming material.

The printing step S1100 includes a step S1150 of forming a printed layer by ejecting a material for pixel printing from the printing head of the inkjet device to an inner side of the bending protection layer BPL formed in the step S1140.

The printing step S1100 includes a step S1160 of pre-curing or curing the plurality of ejection layers formed in the steps S1110 to S1150 using the curing module 500 of the inkjet device.

According to the present invention, the anisotropic conductive layer, the reinforced curing layer, the bending protection layer, and the printed layer may be formed through the plurality of inkjet heads while transferring the display panel D below the heads of the inkjet device by the transfer device 300.

That is, since the anisotropic conductive layer, the reinforced curing layer for the anisotropic conductive layer, and the bending protection layer in a bending area, which are used in used in the bonding process, may be formed by one inkjet device through a printing process in the inkjet device, an effect of reducing a size of bonding equipment and a process time may be obtained.

In addition, since an amount of ink ejected from the head of the inkjet device having high precision is precisely controlled to print only an amount necessary for an electrode of the display panel even when forming the anisotropic conductive layer, an effect of reducing costs by reducing unnecessary consumption of a conductive material used in a portion except for the electrode may be obtained.

For example, an anisotropic conductive film produced in a compression process of the related art includes conductive particles each having a size of about 3 μm to 5 μm and a binder having a thickness of about 20 μm.

When bonding of the film-type anisotropic conductive film is completed, a flow of the anisotropic conductive particles and the binder generated as the thickness decreases from an original thickness of 20 μm to a thickness of 3 μm to 5 μm may be minimized to reduce compression pressure and time.

Particularly, when the anisotropic conductive layer is printed by using the inkjet device and has a thickness less than that of the anisotropic conductive film before bonded, a case of printing by the inkjet device may have an advantage of minimizing a material loss compared to a case of using the typical film type anisotropic conductive laver.

The case of printing by the inkjet device may also have an advantage of enabling application of an exact amount of the bending protection layer or the reinforced curing resin layer because the ink droplets of the ejected material may be adjusted in a unit of picoliters (pl) even when forming the reinforced curing layer by the inkjet device.

The above-described advantages may have an effect of realizing a printing accuracy of several μm and a low thickness deviation depending on an inkjet printing condition, and the printing accuracy may have an effect of securing flexibility of a pattern design of a circuit part.

As illustrated in FIG. 7C, after performing the printing step S1100, the step S1200 of compressing and fixing the display drive integrated circuit DDIC to the anisotropic conductive layer DACF for fixing the display drive integrated circuit.

Figure 7D:
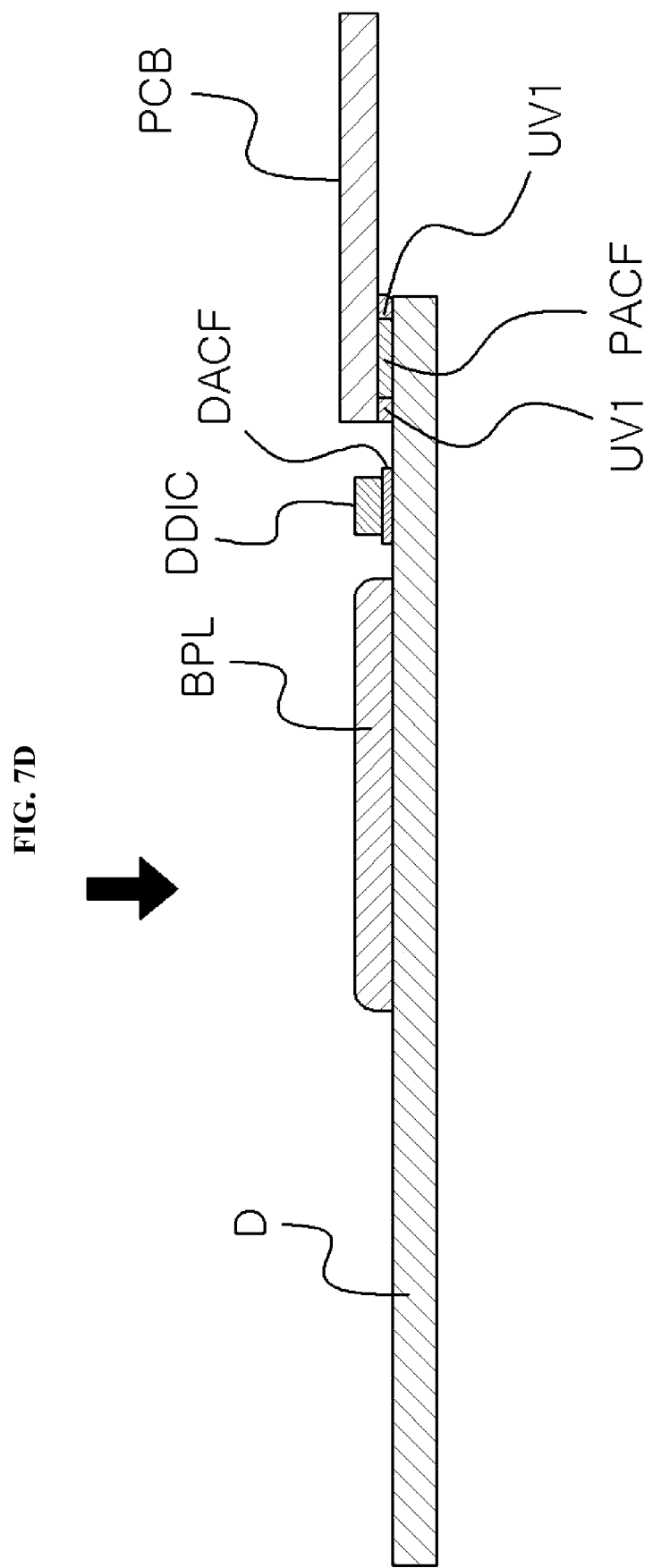

As illustrated in FIG. 7D, after performing the step S1200, the step 1300 of fixing a circuit board PCB to the anisotropic conductive layer PACF and reinforced curing layer UV1 for fixing the circuit board.

The step S1200 and the step S1300 are performed through a separate device instead of the inkjet device according to the present invention.

[Inkjet Device for Chip on Film Process]

Figure 8:
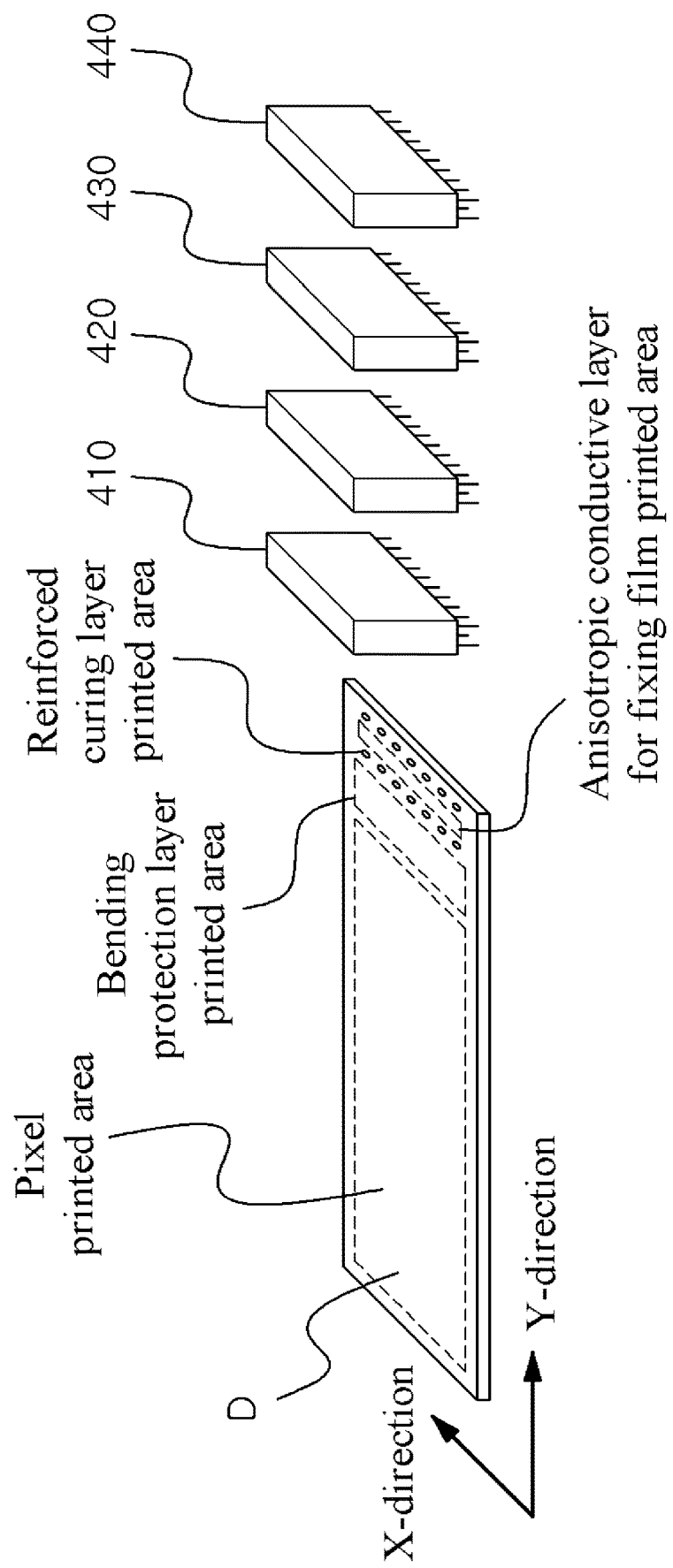
FIG. 8 is a view illustrating the inkjet device that performs a primary printing step to perform a chip on film process in the method for manufacturing the display according to the present invention.

FIG. 8 is a view illustrating the inkjet device that performs a primary printing step to perform the COF process in the method for manufacturing the display according to the present invention.

The inkjet device for performing the primary printing step S2100 to manufacture the display panel through the COF process step S2000 has the same configuration as the inkjet device including the head module in the COP process according to the first embodiment.

That is, as illustrated in FIG. 8, the inkjet device for performing the primary printing step in the COF process includes: a housing 100; a plate 200 for supporting a display panel in the housing 100; a transfer device 300 for transferring the plate 200 in a substrate printing direction; a head module 400 for ejecting ink droplets onto the display panel; and a curing module 500 for curing the ink ejected onto the substrate.

Also, the head module 400 includes: an anisotropic conductive layer ejection head 410; a reinforced curing layer ejection head 420; a bending protection layer ejection head 430; and a pixel printing head 440, which are sequentially arranged in the Y-direction while a longitudinal direction of each thereof is arranged in the X-direction so as to be sequentially formed in a transfer direction (Y-direction) of the display panel while each of a plurality of printed layers extends in a transverse direction (X-direction) of the display panel D.

Figure 9:
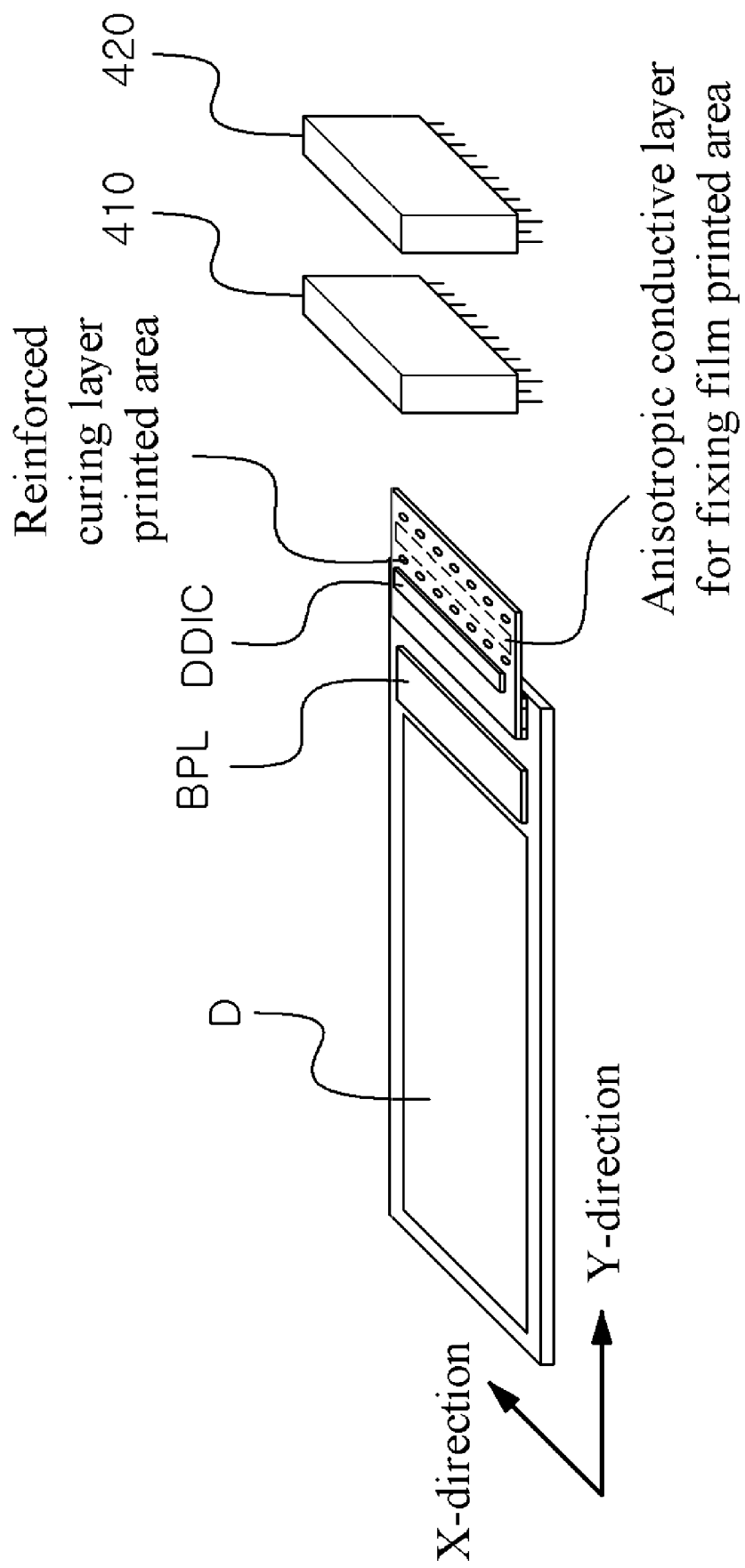
FIG. 9 is a view illustrating the inkjet device that performs a secondary printing step to perform the chip on film process in the method for manufacturing the display according to the present invention.

FIG. 9 is a view illustrating the inkjet device that performs a secondary printing step to perform the COF process in the method for manufacturing the display according to the present invention.

As illustrated in FIG. 9, the inkjet device for performing the secondary printing step in the COF process includes: a housing 100; a plate 200 for supporting a display panel in the housing 100; a transfer device 300 for transferring the plate 200 in a substrate printing direction; a head module 400 for ejecting ink droplets onto the display panel; and a curing module 500 for curing the ink ejected onto the substrate.

Also, the head module 400 includes an anisotropic conductive layer ejection head 410 and a reinforced curing layer ejection head 420, which are sequentially arranged in the Y-direction while a longitudinal direction of each thereof is arranged in the X-direction so as to be sequentially formed in a transfer direction (Y-direction) of the display panel while each of a plurality of printed layers extends in a transverse direction (X-direction) of the display panel D.

[Chip on Film Process]

FIG. 10 is a flowchart representing the COF process step in the method for manufacturing the display according to the present invention. FIGS. 11A to 11D are a view illustrating the COF process step of FIG. 8.

The method for manufacturing the display panel by using the COF process step S1000 according to the present invention is performed as follows.

The COF process step S2000 includes a primary printing step S2100, a film fixing step S2200, a secondary printing step S2300, and a circuit board fixing step S2400.

Figure 11A:
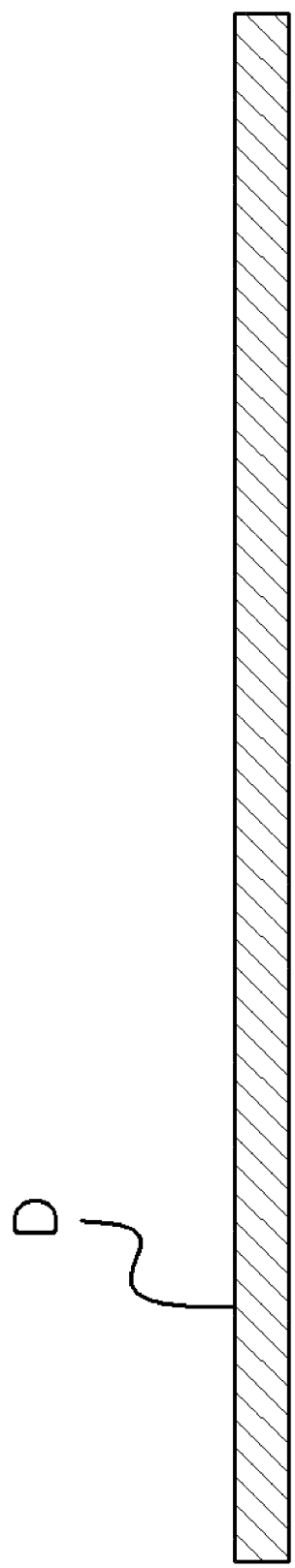
Figure 11B:
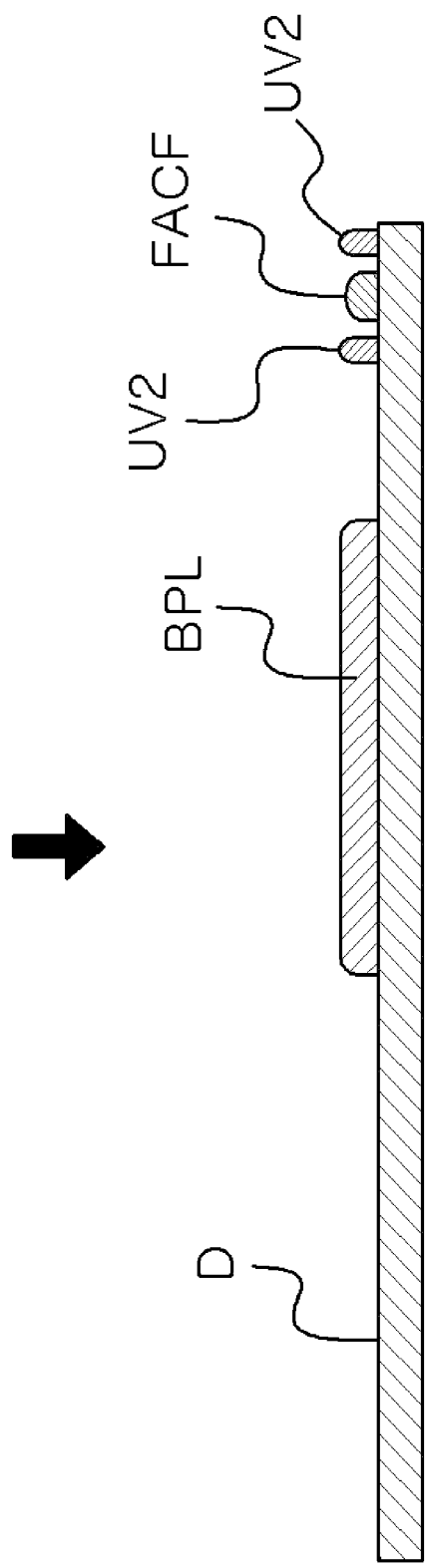

As illustrated in FIG. 11B, the primary printing step S2100 include a step S2110 of forming an anisotropic conductive layer FACF for fixing a film by ejecting an anisotropic conductive layer forming material from the anisotropic conductive layer ejection head of the inkjet device in order to bond the film at an end of the display panel D.

The primary printing step S2100 includes a step S2120 of forming a reinforced curing layer UV2 by ejecting a reinforced curing layer forming material from the reinforced curing layer ejection head of the inkjet device onto a side surface of the anisotropic conductive layer FACF for fixing the film, which is formed in the step S2110.

The reinforced curing layer UV2 may be formed on each of both sides of the anisotropic conductive layer FACF for fixing the circuit board in the step S2120.

The primary printing step S2100 includes a step S2130 of forming the bending protection layer BPL by ejecting a bending protection layer forming material from the bending protection layer ejection head of the inkjet device to an inner side of the reinforced curing layer UV2 formed in the step S2120 for bending protection.

The primary printing step S2100 includes a step S2140 of forming a pixel by ejecting a material for pixel printing from the printing head of the inkjet device to an inner side of the bending protection layer BPL formed in the step S2130.

The primary printing step S2100 includes a step S2150 of pre-curing or curing the plurality of ejection layers formed in the steps S2110 to S2140 using the curing module 500 of the inkjet device.

Figure 11C:
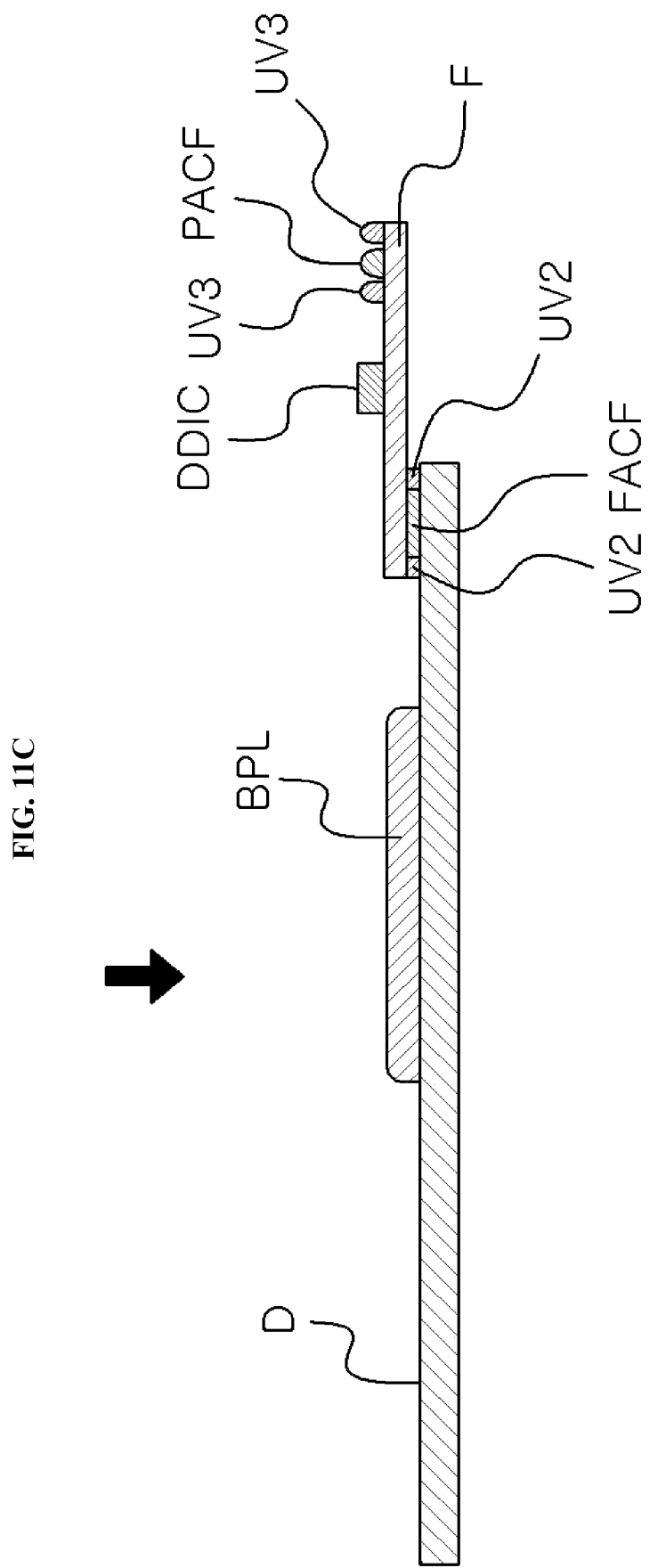

As illustrated in FIG. 11C, the film fixing step S2200 compresses and fixes one end of the film F to which the display drive integrated circuit DDIC is bonded to the anisotropic conductive layer FACF and reinforced curing layer UV2 for fixing the film.

As illustrated in FIG. 11C, the secondary printing step S2300 include a step S2310 of forming the anisotropic conductive layer PACF for fixing the circuit board by ejecting an anisotropic conductive layer forming material from the anisotropic conductive layer ejection head of the inkjet device in order to bond the film at an end of the film F.

The secondary printing step S2300 includes a step S2320 of forming a reinforced curing layer UV3 by ejecting a reinforced curing layer forming material from the reinforced curing layer ejection head of the inkjet device onto a side surface of the anisotropic conductive layer PACF for fixing the circuit board, which is formed in the step S2310.

The secondary printing step S2300 includes a step S2330 of pre-curing or curing the plurality of ejection layers formed in the steps S2310 to S2320 using the curing module 500 of the inkjet device.

As illustrated in FIG. 11D, the circuit board fixing step 2400 compresses and fixes one end of the circuit board PCB to the anisotropic conductive layer PACF and reinforced curing layer UV3 for fixing the circuit board.

The circuit board fixing step 2400 is performed in another device instead of the inkjet device according to the present invention.

The COF process has the same effects described in the COP process except that the printing step of the COF process is divided into two steps due to film bonding.

In the method for manufacturing the display according to the present invention, since the anisotropic conductive layer, the reinforced curing layer for the anisotropic conductive layer, and the bending protection layer in the bending area, which are used in used in the bonding process, may be formed by one inkjet device through the printing process in the inkjet device, the effect of reducing the size of the bonding equipment and the process time may be obtained.

Also, since the amount of the ink ejected from the head of the inkjet device having the high precision is precisely controlled to print only the amount necessary for the electrode of the display panel even when forming the anisotropic conductive layer, the effect of reducing the costs may be obtained by reducing the unnecessary consumption of the conductive material used in a portion except for the electrode as with the related art.

Also, since the ink droplets of the ejected material may be adjusted in the unit of picoliters (pl) even when forming the reinforced curing layer by the inkjet device, the inkjet device may have the advantage of enabling the application of the exact amount of the bending protection layer or the reinforced curing resin layer.

The above-described advantages may have the effect of realizing the printing accuracy of several μm and the low thickness deviation depending on the inkjet printing condition, and the printing accuracy may have the effect of securing the flexibility of the pattern design of the circuit part.

Although the embodiments of the present invention have been described, it is understood that the present invention should not be limited to these embodiments but various changes and modifications can be made by one ordinary skilled in the art within the spirit and scope of the present invention as hereinafter claimed.

What is claimed is:

1. A method for manufacturing a display panel through a chip on plastic process step by using an inkjet device, the method comprising a printing step comprising:
    forming a first anisotropic conductive layer for fixing a circuit board by ejecting a first anisotropic conductive layer forming material from an anisotropic conductive layer ejection head of the inkjet device in order to bond the circuit board to an end of the display panel;
    forming a reinforced curing layer by ejecting a reinforced curing layer forming material from a reinforced curing layer ejection head of the inkjet device onto a side surface of the first anisotropic conductive layer;
    forming a second anisotropic conductive layer for fixing a display drive integrated circuit by ejecting a second anisotropic conductive layer forming material from the anisotropic conductive layer ejection head of the inkjet device to an inner side of the second anisotropic conductive layer and the reinforced curing layer in order to bond the display drive integrated circuit; and
    forming a pixel by ejecting a material for pixel printing from a printing head of the inkjet device to an inner side of the second anisotropic conductive layer for fixing the display drive integrated circuit.

2. The method of claim 1, wherein the reinforced curing layer is formed on each of both sides of the first anisotropic conductive layer for fixing the circuit board in the step.

3. The method of claim 2, wherein the first and second anisotropic conductive layer forming materials are different from each other.

4. The method of claim 3, wherein the printing step further comprises forming a bending protection layer by ejecting a bending protection layer forming material from a bending protection layer ejection head of the inkjet device to an inner side of the reinforced curing layer in order to support bending stress.

5. The method of claim 4, wherein the printing step further comprises pre-curing or curing each of the first anisotropic conductive layer, the reinforced curing layer, the second anisotropic conductive layer, and the pixel.

6. The method of claim 5, further comprising, after performing the printing step, compressing and fixing a display drive integrated circuit to the second anisotropic conductive layer for fixing the display drive integrated circuit.

7. The method of claim 6, further comprising, after forming of the reinforced curing layer, compressing and fixing a circuit board to the first anisotropic conductive layer for fixing the circuit board and the reinforced curing layer.

8. An inkjet device for performing the method of claim 1, the inkjet device comprising:
    a housing;
    a plate configured to support a substrate in the housing;
    a transfer device configured to transfer the plate in a substrate printing direction; and
    a head module configured to eject ink droplets onto the substrate, the head module comprising:
        the anisotropic conductive layer ejection head configured to form the first and second anisotropic conductive layers on the display panel;
        the reinforced curing layer ejection head configured to reinforce the anisotropic conductive layer on the display panel;

a bending protection layer ejection head configured to form a bending protection layer configured to support bending stress on the display panel; and the printing head configured to print the pixel on the display panel.

9. The inkjet device of claim 8, wherein the anisotropic conductive layer ejection head, the reinforced curing layer ejection head, the bending protection layer ejection head, and the pixel printing head are sequentially arranged in a Y-direction while a longitudinal direction of each thereof is arranged in a X-direction so as to be sequentially formed in a transfer direction (Y-direction) of the display panel while each of a plurality of printed layers formed by the head module extends in a transverse direction (X-direction) of the display panel.

10. The inkjet device of claim 8, wherein the anisotropic conductive layer ejection head, the reinforced curing layer ejection head, the bending protection layer ejection head, and the pixel printing head are sequentially arranged in a X-direction while a longitudinal direction of each thereof is arranged in a Y-direction so as to be sequentially formed in a transverse direction (X-direction) of the display panel while each of a plurality of printed layers formed by the head module extends in a transfer direction (Y-direction) of the display panel.

11. The inkjet device of claim 8, wherein the anisotropic conductive layer ejection head, the reinforced curing layer ejection head, the bending protection layer ejection head, and the pixel printing head are sequentially arranged in a X-direction while a longitudinal direction of each thereof is inclined in a Y-direction so as to be sequentially formed in a transverse direction (X-direction) of the display panel while each of a plurality of printed layers formed by the head module extends in a transfer direction (Y-direction) of the display panel.

12. A method for manufacturing a display panel through a chip on plastic process step by using an inkjet device, the method comprising a primary printing step comprising:
    forming a first anisotropic conductive layer for fixing a film by ejecting a first anisotropic conductive layer forming material from an anisotropic conductive layer ejection head of the inkjet device in order to bond the film to an end of the display panel;
    forming a first reinforced curing layer by ejecting a first reinforced curing layer forming material from a reinforced curing layer ejection head of the inkjet device onto a side surface of the first anisotropic conductive layer for fixing the film; and
    forming a pixel by ejecting a material for pixel printing from a printing head of the inkjet device to an inner side of a bending protection layer.

13. The method of claim 12, wherein in the forming of the reinforced curing layer, the first reinforced curing layer is formed on each of both sides of the first anisotropic conductive layer for fixing the film.

14. The method of claim 13, wherein the primary printing step comprises forming the bending protection layer (BPL) by ejecting a bending protection layer forming material from a bending protection layer ejection head of the inkjet device to an inner side of the first reinforced curing layer for bending protection.

15. The method of claim 14, wherein the primary printing step comprises pre-curing or curing the first anisotropic conductive layer, the first reinforced curing layer, and the pixel.

16. The method of claim 15, further comprising, after performing the primary printing step, compressing and fixing one end of a film to which a display drive integrated circuit is fixed to the first anisotropic conductive layer for fixing the film and the first reinforced curing layer.

17. The method of claim 16, further comprising, after compressing and fixing the one end of the film, a secondary printing step comprising:
    forming a second anisotropic conductive layer for fixing a circuit board by ejecting a second anisotropic conductive layer forming material from the anisotropic conductive layer ejection head of the inkjet device in order to bond the film to an end of the film; and
    forming a second reinforced curing layer by ejecting a second reinforced curing layer forming material from the reinforced curing layer ejection head of the inkjet device onto a side surface of the second anisotropic conductive layer for fixing the circuit board.

18. The method of claim 17, wherein the secondary printing step further comprises pre-curing or curing a plurality of ejection layers.

19. The method of claim 18, further comprising, after performing the secondary printing step, compressing and fixing one end of a circuit board to the second anisotropic conductive layer for fixing the circuit board and the second reinforced curing layer.

20. An inkjet device for performing the method of claim 12, the inkjet device comprising:
    a housing;
    a plate configured to support a substrate in the housing;
    a transfer device configured to transfer the plate in a substrate printing direction; and
    a head module configured to eject ink droplets onto the substrate, the head module comprising:
        the anisotropic conductive layer ejection head configured to form the first anisotropic conductive layer on the display panel;
        the reinforced curing layer ejection head configured to reinforce the first anisotropic conductive layer on the display panel;
        a bending protection layer ejection head configured to form the bending protection layer configured to support bending stress on the display panel; and
        the printing head configured to print the pixel on the display panel,
    wherein the anisotropic conductive layer ejection head, the reinforced curing layer ejection head, the bending protection layer ejection head, and the pixel printing head are sequentially arranged in a Y-direction while a longitudinal direction of each thereof is arranged in a X-direction so as to be sequentially formed in a transfer direction (Y-direction) of the display panel while each of a plurality of printed layers formed by the head module extends in a transverse direction (X-direction) of the display panel.

21. An inkjet device for performing the method of claim 17, the inkjet device comprising:
    a housing;
    a plate configured to support a substrate in the housing;
    a transfer device configured to transfer the plate in a substrate printing direction; and
    a head module configured to eject ink droplets onto the substrate, the head module comprising:
        the anisotropic conductive layer ejection head configured to form the first anisotropic conductive layer on the display panel; and the reinforced curing layer ejection head configured to reinforce the first anisotropic conductive layer on the display panel, wherein the anisotropic conductive layer ejection head and the reinforced curing layer ejection head are sequentially arranged in a Y-direction while a longitudinal direction of each thereof is arranged in a X-direction so as to be sequentially formed in a transfer direction (Y-direction) of the display panel while each of a plurality of printed layers formed by the head module extends in a transverse direction (X-direction) of the display panel.

\* \* \* \* \*